United States Patent
Chaudhari

(10) Patent No.: US 10,062,797 B2
(45) Date of Patent: *Aug. 28, 2018

(54) METHOD OF MAKING A IV-VI/SILICON THIN-FILM TANDEM SOLAR CELL

(71) Applicant: Ashok Chaudhari, Briarcliff Manor, NY (US)

(72) Inventor: Ashok Chaudhari, Briarcliff Manor, NY (US)

(73) Assignee: Solar-Tectic LLC, Briarcliff Manor, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/213,998

(22) Filed: Jul. 19, 2016

(65) Prior Publication Data

US 2016/0329453 A1 Nov. 10, 2016

Related U.S. Application Data

(63) Continuation-in-part of application No. 15/207,966, filed on Jul. 12, 2016.

(60) Provisional application No. 62/336,829, filed on May 16, 2016.

(51) Int. Cl.
  *H01L 31/0725* (2012.01)
  *H01L 31/18* (2006.01)
  *H01L 31/0236* (2006.01)
  *H01L 31/032* (2006.01)

(52) U.S. Cl.
  CPC .... *H01L 31/0725* (2013.01); *H01L 31/02363* (2013.01); *H01L 31/02366* (2013.01); *H01L 31/0324* (2013.01); *H01L 31/0326* (2013.01); *H01L 31/18* (2013.01); *Y02E 10/50* (2013.01); *Y02P 70/521* (2015.11)

(58) Field of Classification Search
  CPC .............. H01L 31/0725; H01L 31/18; H01L 31/02363; H01L 31/0326; H01L 31/0324; H01L 31/02366; Y02E 10/50
  See application file for complete search history.

(56) References Cited

U.S. PATENT DOCUMENTS

| 9,054,249 | B2 | 6/2015 | Chaudhari | |
| 9,818,964 | B2* | 11/2017 | Chaudhari | H01L 51/4213 |
| 2010/0261304 | A1* | 10/2010 | Chang | C23C 18/06 438/72 |
| 2013/0125988 | A1* | 5/2013 | Cao | H01L 31/18 136/264 |
| 2013/0217177 | A1* | 8/2013 | Wong | C23C 16/306 438/95 |
| 2014/0264708 | A1* | 9/2014 | Van Duren | H01L 31/18 257/458 |
| 2016/0035927 | A1 | 2/2016 | Gershon et al. | |

FOREIGN PATENT DOCUMENTS

WO 2016094966 A1 6/2016

OTHER PUBLICATIONS

Chung et al. Hybrid Dielectric Light Trapping Designs for Thin-Film CdZnTe/Si Tandem Cells, May 2016, pp. 1-13, Optics Express, USA.
Yuan et al. "High Efficiency All-Polymer Tandem Solar Cells", May 2016, pp. 1-7, vol. 6, Article No. 26459, Scientific Reports, China.
Battaglia, et al. "High-Efficiency Crystalline Silicon Solar Cells: Status and Perspectives" Feb. 2016, pp. 1552-1576, vol. 9, Energy & Environmental Science, Royal Society of Chemistry, UK.
Sivaram, V. et al. "Out-Shining Silicon", Jul. 2015, pp. 54-59., Scientific American, USA.
Li J. et ano. "The Role of Grain Boundaries in CZTS-Based Thin-Film Solar Cells", 2015, pp. 313-333, Copper Zinc Tin Sulfide-Based Thin-Film Solar Cells, First Ed., John Wiley & Sons Ltd., UK.
Nelson, J. "The Physics of Solar Cells", Jan. 2003 pp. 1-363, First Ed., Imperial College Press, UK.
Katagiri, H. (ed. K. Ito) 2014, Copper Zinc Tin Sulfide-Based Thin-Film Solar Cells, Chapt. 8, John Wiley & Sons Ltd., UK.
Song, X. et al. "A Review on Development Prospect of CZTS Based Thin Film Solar Cells", May 2014, pp. 1-11, International Journal of Photoenergy, Hindawi Publishing Corp., USA.
Luque, A. et al. (ed.) "Handbook of Photovoltaic Science and Engineering", 2011, Second Edition, John Wiley & Sons Ltd., UK.
Voznyi, A. et al. "Structural and Electrical Properties of SnS2 Thin Films", 2016, pp. 1-10, Materials Chemistry and Physics, Elsevier, USA.
Burton, L. et al. "Electronic and Optical Properties of Single Crystal SnS2: an Earth-Abundant Disulfide Photocatalyst", 2016, pp. 1312-1318, Journal of Materials Chemistry A, The Royal Society of Chemistry, UK.
Reddy V. et al. "Development of Sulpherized SnS Thin Film Solar Cells", 2015, vol. 15, pp. 588-598, Current Applied Physics, Elsevier, USA.
Burton, L. et al. "Synthesis Characterization, and Electronic Structure of Single-Crystal SnS, Sn2S3, and SnS2", 2013, pp. 4908-4916, Chemistry of Materials, ACS Publications, USA.

(Continued)

*Primary Examiner* — Thanh T Nguyen
(74) *Attorney, Agent, or Firm* — Danielle C. Sullivan; CarterLedyard & Milburn LLP

(57) ABSTRACT

A simple manufacturing method is provided for the fabrication of the IV-VI group of semiconductor films on inexpensive substrates for highly efficient tandem or multi junction solar cells and a variety of other electronic devices such as transistors and LEDs. Specifically, the method includes depositing a textured oxide buffer on a substrate; depositing a metal-inorganic film from a eutectic alloy on the buffer layer, the metal being a component of a IV-VI compound; and forming a layer on the metal-inorganic film on which an additional element from the IV-VI compound is added, forming a IV-VI layer on a semiconductor device. The films comprising tin sulfides—SnS (tin sulphide), $SnS_2$, and $SnS_3$—are grown on inexpensive substrates, such as glass or flexible plastic, at low temperature, allowing for R2R (roll-to-roll) processing.

20 Claims, No Drawings

(56) References Cited

OTHER PUBLICATIONS

Burton, L. et ano. "Phase Stability of the Earth-Abundant Tin Sulfides SnS, SnS2, and Sn2S3", 2012, pp. 24262-24267, The Journal of Physical Chemistry, ACS Publications, USA.

Zeman, M. "Advanced Amorphous Silicon Solar Cell Technologies", Thin Film Solar Cells: Fabrication, Characterization and Applications, 2006, pp. 1-66, John Wiley & Sons Ltd., UK.

* cited by examiner

METHOD OF MAKING A IV-VI/SILICON THIN-FILM TANDEM SOLAR CELL

This application is a continuation-in-part of U.S. patent application Ser. No. 15/207,966, filed Jul. 12, 2016, entitled "Method of Making a CZTS/Silicon Thin-Film Tandem Solar Cell," which claims priority to U.S. Provisional Patent Application No. 62/336,829 filed May 16, 2016, and are hereby incorporated by reference in their entirety.

FIELD OF INVENTION

The present invention relates to IV-VI/Silicon thin-film solar cells, transistors, light emitting diodes, and other electronic devices.

BACKGROUND OF THE INVENTION

In the solar cell technology invented by the late Dr. Praveen Chaudhari, a method is disclosed (U.S. Pat. No. 9,054,249 B2) for making a tandem solar cell in which a "thin-silicon film can be used for heteroepitaxial deposition of other semiconductors, which might be more efficient converters of light to electricity." The material "CZTS" or Copper Zinc Tin Sulfide is a quaternary semiconducting compound which has received increasing interest since the late 2000's for applications in solar cells. CZTS provides good optical properties and has a band-gap energy from approximately 1 to 1.5 eV depending on the degree of substitution of S with Se and a large absorption coefficient in the order of 104 cm-1. In August, 2012, IBM announced they had developed CZTS solar cell capable of converting 11.1% of solar energy to electricity. Recent material improvements for CZTS have increased efficiency to 12.0% in laboratory cells, but more work is needed for their commercialization. Properties such as carrier lifetime (and related diffusion length) are low (below 9 ns) for CZTS. This low carrier lifetime may be due to high density of active defects or recombination at grain boundaries.

If a tandem solar panel could reach 30 percent efficiency, the impact on the balance-of-system cost could be enormous: only two thirds of the number of panels would be needed to produce the same amount of power as panels that are 20 percent efficient, greatly reducing the amount of roof space or land, installation materials, labor and equipment. (Sivaram et al. "Outshining silicon . . . ", Scientific American, 2015). The maximum efficiency for a two junction tandem under the AM1.5G spectrum and without concentration is 47%. At the peak efficiency the top cell has a bandgap of 1.63 eV and the bottom cell has a bandgap of 0.96 eV.

The theoretical limits to multi junction efficiencies for conversion with 1,2,3, and 36 bandgaps is 37, 50, 56 and 72% respectively. The improvement in efficiency from one to two bandgaps is considerable, but the returns diminish as more bandgaps are added. This is fortunate since the practicality of a device with five or more junctions is questionable. (*Handbook of Photovoltaic Science and Engineering*, Luque and Hegedus, p. 319).

The concept of the stacked solar cell was introduced to increase output voltage of a-Si:H solar cells. Only later it was recognized that stacked cells also offer a practical solution for improving the stabilized performance of a-Si:H based solar cells. Different terms such as tandem or dual junction or double junction solar cells are used in the literature to describe a cell in which two junctions are stacked on top of each other. A stack of three junctions is named a triple junction solar cell. The multi junction solar cell structure is far more complex than the single junction solar cell. For its successful operation there are two crucial requirements: (i) the current generated at the maximum power point has to be equal in each component cell (current matching) and (ii) an internal series connection between the component cells has to feature low electrical and optical losses. The internal series connection is accomplished at the p-n junction, where the recombination of oppositely charged carriers arriving from the adjacent component cells takes place. (M. Zeman "Advanced Amorphous Silicon Solar Cell Technologies").

The requirement of current matching reflects the fact that component cells function as current sources which are connected in series. The component cell that generates the lowest current determines the net current flowing through the stacked two terminal cell. In order to avoid current losses, each component cell should generate the same current. The current generated by a component cell depends mainly on the absorption in the absorber layer of the cell, which is determined by the thickness of the absorber. Current is matched by adjusting the thickness of the absorber layer of each component cell. (M. Zeman "Advanced Amorphous Silicon Solar Cell Technologies").

The tunnel recombination junction deals with the interface between the component cells. This interface is in fact a p-n diode. An ohmic contact between the component cells is required for proper operation of the stacked solar cell. The problem of obtaining the ohmic contact between the component cells can be resolved by fabricating a so-called tunnel recombination junction. This junction ensures that the electrons arriving at the n-type layer of the top cell and the holes arriving at the p-type layer of the bottom cell fully recombine at this junction. The recombination of the photogenerated carriers at this interface keeps the current flowing through the solar cell. A very high electric field in this reverse biased p-n junction facilitates tunneling of the carriers towards the defect states in the center of the junction. The effective recombination of the carriers takes place through these defective states. A tunnel recombination junction is usually realized by using microcrystalline silicon for at least one of the doped layers in order to obtain good ohmic contact. Another approach is to incorporate a thin oxide layer at the interface between the two component cells that serves as an efficient recombination layer. When the p-n junction functions as a good ohmic contact, the $V_{oc}$ of the stacked cell is the sum of the open circuit voltages of the component cells. (M. Zeman "Advanced Amorphous Silicon Solar Cell Technologies").

SUMMARY OF THE INVENTION

In the present invention disclosed herein, the crystalline silicon thin-film can serve as the tunneling junction, or the metal from the eutectic alloy can be oxidized to form the thin oxide layer at the interface between the two component cells that serves as an efficient recombination layer. Alternatively, the metal film can remain un-oxidized. Ohmic contacts to semiconductors are typically constructed by depositing thin metal films of a carefully chosen composition. It should be noted that in the technology invented by the late Dr. Praveen Chaudhari (referred to in the introduction), no intermediate layer between the two semiconductor materials—say silicon and CZTS—is required.

CZTS has a bandgap of 1.4-1.5 eV which is greater than the 1.11 eV bandgap of silicon, and so it qualifies as material for a tandem solar cell, where CZTS is the top layer absorbing a wider range of light than the bottom silicon layer. In tandem, these materials make for a very potent, high efficiency solar cell not only because of the respective bandgaps, but also because the lattice parameters which are almost identical: CZTS=0.5435 nm, Si=0.5431. Germanium also has a similar lattice parameter: 0.5658 and may in fact make for a better material in tandem with CZTS given its lower bandgap than Si—namely 0.6 eV. And although a recent analysis revealed that established thin-film technologies based on hydrogenated amorphous silicon or the family of CIGS and CZTS compounds cannot offer a wide bandgap top cell with sufficient efficiency to improve or even maintain the efficiency of a>25.0% efficient silicon bottom cell (see C. Battaglia et al.), this remains to be seen regarding thin-film crystalline silicon (TFcSi) as a bottom layer or thin-film crystalline germanium which has an even lower bandgap of 0.6 eV. Moreover, for solar-energy conversion using a single junction photovoltaic cell, the ideal bandgap has been variously estimated from around 1.0 eV up to around 1.5 eV depending on various assumptions because that low wavelength threshold covers nearly the entire solar spectrum that reaches the Earth's surface. Considering this fact, CZTS with its 1.5 eV is likely to be a good combination with thin-film crystalline Si with its 1.1 eV bandgap. Finally, wide bandgap materials are often utilized in applications in which high-temperature operation is important. It may be that the wide bandgap tandem device invented here will show an advantage over silicon wafer solar cells (c-Si) for this reason.

Following the patented procedure invented by P. Chaudhari and disclosed in U.S. Pat. No. 9,054,249, silicon from a metal-inorganic eutectic alloy is deposited on buffered glass. Many materials can be used, including silicon and germanium. By using Sn (tin) as the metal, the Sn in the Sn—Si eutectic alloy which is deposited on the glass can serve as the source of the Sn to the "Copper Zinc Tin Sulfide" (CZTS) material by contributing the Sn which is formed on top of the Si—Sn layer after the Si—Sn film has been deposited and the Sn segregates to the surface of the Si film. Thus, when the other chemical elements of the CZTS film are deposited on the Sn—Si film they combine with the Sn to form a CZTS layer. This process not only serves as a way of forming the CZTS film, but also helps to eliminate the etching step to remove the Sn from the Si film which is necessary for forming the Si thin-film on glass capable of functioning as a tandem solar cell. Moreover, since the silicon on the buffer layer has a preferential [111] orientation, it serves to induce a preferential orientation in the CZTS film as well. While there is some speculation that grain boundaries may be benign in the CZTS material (as is the case with CIGS and CdTe), this has yet to be confirmed (B. Clemens et al.). Thus preferential orientation or texture may help with regard to issues of defects and grain boundaries since the grains are aligned. And if the grain size of the silicon film is large enough the grain size of the CZTS film can also be increased. It is well known that metal induced crystallization (eutectics) increases the grain size of semiconductor films such as silicon or germanium for example. Also, because the lattice parameters of Si and Ge are almost identical to CZTS (CZTS=0.5435 nm, Si=0.5431, Ge: 0.5658.) heteroepitaxial growth of the CZTS on the Si or Ge or other inorganic layer for a "monolithic" tandem cell is greatly enhanced.

Finally, it is well known that the thickness of the sub cell is the critical factor for the PCEs of the tandem. This invention allows for a thin layer of silicon or other inorganic material to replace the thicker silicon wafer material that is normally used in tandem cells. This flexibility has potentially many advantages, ranging from the ability to control and voltage to the current, to material cost, and absorption coefficient. For example, changing the thickness will change the absorption which in turn changes the current. It should be noted that in some tandem solar cells it has been shown that material thicknesses is the same for both the top cell and the sub-cell (J. Yuan et al.). A thin-film bottom cell such as the one used here allows for this possibility.

The present invention provides a simple method for forming a CZTS/silicon thin-film tandem solar cell.

The present invention also provides a simple method of forming a CZTS/silicon thin-film that is low in defects and has few grain boundaries.

The present invention also provides a simple method of forming a CZTS/silicon thin-film that has texture (or preferential orientation).

The present invention also provides a simple method of forming a CZTS/silicon thin-film that is smooth and uniform.

DETAILED DESCRIPTION

When the actual CZTS/silicon thin-film tandem solar cell device is made, the CZTS material can be deposited on the Si layer using one of any number of deposition processes known in the art: Electrochemical deposition, Vacuum deposition (co-evaporation), Electron beam evaporation, Spray pyrolysis, Pulsed laser deposition, and Sol-gel (see X. Song, "A Review on Development Prospect of CZTS Based Thin-Film Solar Cells" 2014). For illustrative purposes, we choose co-evaporation used by IBM in 2010: Cu, Zn and Sn evaporation sources of Knudsen type and Veeco S source box in metal tantalum with valves were used, and the substrate was heated to 110° C. to 150° C. After deposition, the 600 nbm film was annealed for 5 minutes at 570° C. (X. Song, "A Review on Development Prospect of CZTS Based Thin-Film Solar Cells" 2014). It is important to emphasize that deposition of the CZTS can be by low-temperature since this means that it is compatible with the inorganic thin-film material and glass substrate on which the CZTS is deposited. CZTS has been prepared by a variety of vacuum and non-vacuum techniques. They mostly mirror what has been successful with CIGS, although the optimal fabrication conditions may differ. Methods can be broadly categorized as vacuum deposition vs. non-vacuum. In the past decade there has been increasing interest and progress in non-vacuum processes owing to their potential lower capital costs and flexibility to coat large areas. Since the tin-silicon eutectic temperature or crystallization temperature is low, the entire deposition process can take place in vacuum "in-line"—without breaking vacuum.

The formation of the p-n junction, known by those skilled in the art to be a requirement, can be "heterojunction" style. A heterojunction uses two different materials of different bandgaps. This design can improve carrier collection. It may also be a necessity because of the doping properties of the available materials. At the junction there will be a discontinuity in the conduction and valence band edges due to the change in the bandgap. This potential step introduces different effective fields for electrons and holes which usually assist the electrostatic field for one carrier and oppose it for the other. (J. Nelson "The Physics of Solar Cells".) In such a design, current matching of the two materials is likely to be a necessity and can be controlled by adjusting the bandgaps of the materials, particularly that of the CZTS top layer (H. Chung et al.). In a two terminal tandem device, the total number of incident photons is ideally split equally between the two subcells, so that the number of electron-hole pairs generated in each subcell is the same, resulting in a "matched" current density (C. Battaglia et al.).

A particular challenge for fabrication of CZTS and related alloys is the volatility of certain elements (Zn and SnS) which can evaporate under reaction conditions. Once CZTS is formed, element volatility is less of a problem but even then CZTS will decompose into binary and ternary compounds in vacuum at temperatures above 500° C. Currently the best CZTS devices have been achieved through certain chemical methods which allow CZTS formation at low temperatures avoiding volatility problems. Using a Sn-semiconductor eutectic alloy allows for a low enough temperature for a deposition method involving both layers of the tandem cell, the CZTS as well as the crystalline silicon, which can facilitate the manufacturing process and lower expenses due to less energy consumption and a streamlined or "in-line" process. If e-beam evaporation is used for this process, then it may also be desirable to use it for the formation of the CZTS film. And indeed this has been demonstrated (Katagiri et al.).

The process disclosed in this invention can be applied to any compound semiconductor, such as GaInP, etc. with a wide bandgap. In this case, the appropriate metal is selected for the eutectic alloy. For example, if a GaInP film is desired, then Ga or In or both would be selected at the eutectic metal. And in fact the process disclosed here also applies to the copper (Cu) in the CZTS, as Cu also forms a eutectic alloy with inorganic films such as Si.

Many research groups have reported a scaffold such as $TiO_2$ on which a semiconductor layer such as a perovskite film, for example MAPbI, is then deposited. It was also suggested that an insulating scaffold such as $Al_2O_3$ act as a buffer layer, minimizing short circuits, or additionally, the presence of the porous scaffold may be advantageous in the case of perovskite crystallization or film formation. If the insulating scaffold, it has been postulated, does have certain advantages, then it would seem unnecessary to limit the technology to perovskites. Therefore, in one embodiment of the invention disclosed here, the CZTS film can also be formed directly on an insulator. In this case, the metal, for example Sn or In, is deposited on the MgO directly, and spread evenly over the substrate after some heating. When the Sn is film has completely covered the substrate and is continuous, the other components, C,Z and S are added to the Sn, forming the final CZTS layer.

As already stated, the CZTS material can be deposited on the Si layer using one of many deposition processes known in the art: Electrochemical deposition, Vacuum deposition (co-evaporation), Electron beam evaporation, Spray pyrolysis, Pulsed laser deposition, and Sol-gel (see X. Song, "A Review on Development Prospect of CZTS Based Thin-Film Solar Cells" 2014). Annealing the CZTS film at 570° C. also improves the crystallinity by removing any amorphous phases, and enlarging the grain size of the Si film which has been deposited and has crystallized. This enhances the overall performance of the tandem cell. In fact, high performance CZTS layers require processing temperatures above 450° C. for maximum performance (Gershon et al.). As the melting temperature of soda-lime glass is ~570° C. and Sn has a low eutectic temperature with inorganic materials such as silicon or germanium, CZTS is a material that is highly compatible with the silicon thin-film deposition process described here for the under layer in the tandem solar cell.

EXAMPLE 1

A good high vacuum system with two electron beam guns is used to deposit tin and silicon independently. A glass substrate coated with textured MgO is held at temperatures between 575 and 600° C. These are nominal temperatures. It is understood to one skilled in the art that lower or higher temperatures can also be used depending upon the softening temperature of the glass substrate or the reaction kinetics of either tin (Sn) or silicon (Si) with the MgO layers when used a substrates. A thin Sn film of approximately 10 nm thickness is deposited first. This is followed by a Si film deposited at a rate of 2 nm per minute on top of the Sn film. The Si film nucleates heterogeneously on the MgO surface to form the desired thin film. The film can now be cooled to room temperature, where the film now comprises of two phases: tin and a relatively large grained and highly textured film of silicon on MgO. The Sn diffuses to the surface of the Si film, driven by its lower surface energy relative to the silicon surface. Rather than etching the film in a solution, which removes the Sn from the two phases, Sn and Si, leaving behind a Si film (practiced in U.S. Pat. No. 9,054,249) the Sn from the Si—Sn film can now be used as a surface on which to deposit the other CZTS elements combining to form a CZTS film. For the Si—Sn deposition we have used two electron beam guns as an illustrative example. It is understood to one skilled in the art that other methods such as a single gun with multiple hearths, chemical vapor deposition, thermal heating, or sputtering can also be used. For the other CZTS elements, copper, zinc, sulfide, deposition can take place by co-evaporation following the process used by IBM in 2010 (not invented here): Cu, Zn and Sn evaporation sources of Knudsen type and Veeco S source box in metal tantalum with valves were used, and the substrate was heated to 110° C. to 150° C. After deposition, the 600 nbm film was annealed for 5 minutes at 570° C. (X. Song, "A Review on Development Prospect of CZTS Based Thin-Film Solar Cells" 2014).

EXAMPLE 2

Just like Example 1, but the Sn is deposited directly on the textured buffer layer—say MgO [111]. The Sn then spreads uniformly over the substrate. The other components of the CZTS film are added using co-evaporation in the following way, different from example 1: Cu, ZnS are evaporated onto the continuous Sn film in presence of Sulphur (evaporated from a Knudsen cell) using an evaporation source consisting of a cylindrical graphite crucible which includes two coaxial chambers which improve the homogeneity in chemical composition of the CZTS films both laterally and in depth which is not possible using laterally separated crucibles to evaporate the precursors. Cu and Zns evaporate in different chambers due to the fact that ZnS evaporates at a lower temperature. The thicknesses of the films can vary according to the desired outcome, and adjusted to optimize results. In addition to forming a uniform, homogeneous film, as the components are added the CZTS crystallizes and replicates the 111 texture of the MgO film. The final film formed is CZTS [111]. The CZTS layer on the textured MgO [111] film will replicate texture and obtain a preferred [111] orientation. A solar cell can now be made from this material following known processes in the art.

EXAMPLE 3

Just like in sample 2, a good high vacuum system with two electron beam guns is used to deposit tin and silicon independently but this time, again following the recipe in U.S. Pat. No. 9,054,249, an organic substrate is used instead of glass or metal tapes, and no buffer layer is used. A thin Sn film of approximately 10 nm thickness is deposited first. This is followed by an even thinner Si film than in the previous examples, deposited at a rate of 2 nm per minute on top of the Sn film. The Si film nucleates heterogeneously on the organic substrate surface to form the desired thin film. (The film can be subsequently thickened by using higher temperature processes to optimize its photovoltaic properties.) The film can now be cooled to room temperature, where the film now comprises of two phases: tin and a relatively large grained and highly textured film of silicon on MgO. The Sn diffuses to the surface of the Si film, driven by its lower surface energy relative to the silicon surface. Rather than etching the film in a solution, which removes the Sn from the two phases, Sn and Si, leaving behind a Si film (practiced in U.S. Pat. No. 9,054,249) the Sn from the Si—Sn film can now be used as a surface on which to deposit the other CZTS elements combining to form a CZTS film. For the Si—Sn deposition we have used two electron beam guns as an illustrative example. It is understood to one skilled in the art that other methods such as a single gun with multiple hearths, chemical vapor deposition, thermal heating, or sputtering can also be used. For the other CZTS elements, copper, zinc, sulfide, deposition can take place by co-evaporation following the process used by IBM in 2010 (not invented here): Cu, Zn and Sn evaporation sources of Knudsen type and Veeco S source box in metal tantalum with valves were used, and the substrate was heated to 110° C. to 150° C. After deposition, the 600 nbm film was annealed for 5 minutes at 570° C. (X. Song, "A Review on Development Prospect of CZTS Based Thin-Film Solar Cells" 2014). The organic film here can be many materials, for example polyimide, and can be flexible for R2R (roll-to-roll) processes.

EXAMPLE 4

Rather than depositing a CZTS layer as in the previous example, a IV-VI semiconductor material such as SnS (tin sulfide) can be used as the top cell and formed by basically the same process as in the previous examples. The inorganic film, say silicon (Si) or germanium (Ge), is deposited on the oxide buffer layer on glass (soda-lime or flexible glass) using Sn in the eutectic melt, as per process by P. Chaudhari disclosed in U.S. Pat. No. 9,054,249. The inorganic film is textured (with in-plane, out-of-plane, or biaxial orientation). As in previous examples the metal segregates on the surface of the Si film, and can then be used to make the SnS layer by adding sulfur onto the metal Sn layer (on Si) using any number of deposition methods well-known by those skilled in the art of material growth of this particular system (Reddy et al.). Examples of deposition methods are e-beam evaporation, spray pyrolysis, co-evaporation, sputtering and sulfurization. Here for illustrative purposes only, we choose sulfurization.

Metallic tin precursors which are on the Si (or Ge) film surface are sulfurized by a sulfurization system in chamber that has been evacuated using a rotary pump and then flushed with argon gas for a few minutes to avoid the presence of impurities in the chamber. Thereafter, sulfurization is performed in the range of 150-450° C. for a fixed time period of 120 minutes and then the films are allowed to cool down naturally to room temperature.

The molar ratios of Sn and S can vary depending on desired outcome, and the film thicknesses (which determine absorption capability as well as current) can also vary, though generally only a very thin film (<5 μm) is required. As the substrate has been heated before deposition, post annealing of the SnS/Si material is not necessary contrary to common practice and is a distinguishing feature of this invention, where the films are deposited "as is". However, if appropriate, extra annealing can be performed. The films made using this process will be smooth and uniform since a metal layer Sn is formed in advance of the addition of the S (sulfur). Smoothness and uniformity are important for device performance, whether it be for photovoltaic devices, light emitting diodes, or many other electronic devices. Multiple junctions replicating this process can be fabricated for even higher efficiencies than is achieved with two layers.

Since SnS exhibits both p- and n-type conductivity depending on the concentration of Sn, the SnS layer can serve as part of a p-n junction for a tandem solar cell. SnS has a band gap of ~1.35 eV-1.4 eV which is larger than Si and Ge and therefore is complementary with either (1.4 eV is actually the optimum band gap for maximum efficiency according to the Shockley-Queisser limit within the AM 1.5 solar spectrum (Burton et al.). If a thin metal film for a recombination layer is desired at the junction of the two materials (p-n junction), Sn can provide this function and if desirable can be oxidized to form tin oxide which is known to be an electron selective layer (ESL). In the latter case, the ESL can be fabricated without high temperature annealing, thus saving production cost and energy payback time significantly (K. Wang et al.).

Importantly, the Si (or Ge) and IV-VI system (SnS) are textured. That is, they have in-plane or out-of-plane or biaxial orientation. This greatly improves the electrical properties and capabilities. Moreover, the SnS film grown here can be single phase.

EXAMPLE 5

Just like in sample 4 above, but rather than a SnS film a $SnS_2$ (tin disulphide) film is grown. $SnS_2$ is a 2D crystal structure. It has a wider bandgap than SnS, 2.18-2.44 eV (Burton et al.). $SnS_2$ is the ground state of SnS. $SnS_2$ is potentially useful as an n-type layer for a p-n junction. And single atomic layers of $SnS_2$ have been found to achieve an incident photon to current conversion efficiency of 38% (Burton et al). In other words, the n-type conductivity, high optical absorption coefficient, and relatively high charge carrier mobility, make it promising for use in thin-film solar cell as well as other electronic devices. $SnS_2$ films can be formed as in example 1, using spray pyrolysis, or thermal vacuum evaporation (Voznyi et al.).

EXAMPLE 6

Just like in sample 5 above, but rather than a $SnS_2$ film a $SnS_3$ film is grown. $SnS_3$ has a bandgap of 0.95 ev-2.20 eV (Burton et al.).

What is claimed is:
1. A method of growing a IV-VI semiconductor film for a semiconductor device comprising:
   depositing a textured oxide buffer on a substrate;
   depositing a metal-inorganic film from a eutectic alloy on said buffer layer, said metal-inorganic film comprising a metal layer and an inorganic film layer, said metal layer comprising a component of a IV-VI compound;
   segregating said metal film layer from said inorganic film layer and diffusing said metal film layer to a surface of said inorganic film layer;

depositing an additional component of said IV-VI compound on said metal film layer, forming a IV-VI layer of said semiconductor device.

2. The method of claim 1, wherein said IV-VI layer comprises tin sulphide.

3. The method of claim 2, wherein said tin sulphide is a single phase.

4. The method of claim 1, wherein said metal layer comprises tin.

5. The method of claim 1, wherein said substrate is an organic flexible plastic or polyimide.

6. The method of claim 1, wherein said semiconductor device is a tandem solar cell.

7. The method of claim 1, wherein said additional component is added by electron beam evaporation.

8. The method of claim 1, wherein said additional component is sulphur.

9. The method of claim 8, wherein said sulphur is added by sulphurization.

10. The method of claim 1, further comprising forming a thin-film with said metal film layer, said thin-film serving as an electron selector layer (ESL).

11. The method of claim 1, further comprising forming an electron selector layer by oxidizing said metal film layer.

12. The method of claim 11, wherein said oxidized metal film layer is $SnO_2$.

13. The method of claim 1, wherein said substrate is a flexible glass.

14. The method of claim 1, further comprising depositing additional layers for a multi junction solar cell.

15. The method of claim 1, wherein said semiconductor device is a light emitting diode.

16. The method of claim 1, wherein said semiconductor device is a transistor.

17. The method of claim 1, wherein said IV-VI layer is textured.

18. The method of claim 1, wherein said IV-VI layer is tin disulphide.

19. The method of claim 1, wherein said IV-VI layer is a n-type.

20. The method of claim 1, wherein said IV-VI layer is tin trisulphide.

* * * * *